US 11,618,325 B2

(12) United States Patent
Brüske

(10) Patent No.: US 11,618,325 B2
(45) Date of Patent: Apr. 4, 2023

(54) DIAGNOSIS OF THE ACTIVE DISCHARGE OF A HV INTERMEDIATE CIRCUIT

(71) Applicant: AUDI AG, Ingolstadt (DE)

(72) Inventor: Stephan Brüske, Ingolstadt (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 17/387,000

(22) Filed: Jul. 28, 2021

(65) Prior Publication Data
US 2022/0126697 A1 Apr. 28, 2022

(30) Foreign Application Priority Data
Oct. 26, 2020 (DE) ...................... 10 2020 128 049.1

(51) Int. Cl.
G01R 31/00 (2006.01)
B60L 3/00 (2019.01)

(52) U.S. Cl.
CPC .......... B60L 3/0023 (2013.01); G01R 31/006 (2013.01)

(58) Field of Classification Search
CPC ................ G01R 31/006; G01R 31/007; B60L 3/0023–0084
See application file for complete search history.

(56) References Cited

U.S. PATENT DOCUMENTS

| 5,805,054 A | 9/1998 | Baxter | |
| 2014/0285210 A1* | 9/2014 | Kanzaki | ................... B60L 3/04 324/503 |
| 2016/0226410 A1* | 8/2016 | Lopez De Arroyabe | .................... B60L 7/003 |
| 2019/0173390 A1* | 6/2019 | Takegawa | ............... H02P 25/24 |
| 2021/0008983 A1* | 1/2021 | Wind | ........................ B60L 3/04 |
| 2022/0134897 A1* | 5/2022 | Misawa | ................ B60L 53/302 320/109 |

FOREIGN PATENT DOCUMENTS

| CN | 104827991 A | 8/2015 | |
| DE | 10 2013 014 609 A1 | 3/2014 | |
| DE | 102013014609 A1 * | 3/2014 | ............ H02M 5/458 |
| DE | 102012020019 A1 * | 4/2014 | ................ B60L 3/04 |
| DE | 10 2012 221 319 A1 | 5/2014 | |
| DE | 10 2013 226 763 A1 | 6/2015 | |
| DE | 10 2019 200 861 A1 | 7/2020 | |
| EP | 1 149 744 A2 | 10/2001 | |
| JP | 2016086578 A * | 5/2016 | |

OTHER PUBLICATIONS

Examination Report dated Jun. 7, 2021 in corresponding German application No. 10 2020 128 049.1; 24 pages including Machine-generated English-language translation.

* cited by examiner

Primary Examiner — Patrick Assouad
Assistant Examiner — Demetrius R Pretlow
(74) Attorney, Agent, or Firm — Maier & Maier, PLLC

(57) ABSTRACT

A method and a device for the diagnosis of the active discharge of a HV intermediate circuit of an electric vehicle.

15 Claims, 2 Drawing Sheets

DIAGNOSIS OF THE ACTIVE DISCHARGE OF A HV INTERMEDIATE CIRCUIT

FIELD

The disclosure relates to a method and a device for the diagnosis of the active discharge of a HV intermediate circuit of an electric vehicle.

BACKGROUND

The disclosure relates to power electronics for an electric drive of a motor vehicle. With power electronics acting as traction inverters, three-phase electrical machines are usually controlled. Due to legal requirements, a specified discharge time must be observed for discharging the HV intermediate circuit in the event of a fault or after the shutdown. For this purpose, for example, a switch (IGBT or MOSFET) can be connected in series with a resistor. When the active discharge is requested, the switch is switched on and the electrical energy of the HV intermediate circuit is converted into thermal energy via the resistor.

The active discharge is given an ASIL (Automotive Safety Integrity Level) classification by the OEM through a hazard and risk analysis in accordance with ISO 26262. The safety objective is a classification in ASIL A. The control signal is read back to detect an unintentional switching on of the active discharge switch. Due to the necessary galvanic separation between the low-voltage circuit (LV) and the high-voltage circuit (HV), an isolating element (e.g. a digital insulator) must be used for this purpose. The additional insulating element increases the costs of the pulse-controlled inverter and is not required for the basic function of the traction inverter.

CN 104827991 A discloses a control method and system of a vehicle with a storage battery and a low voltage load which is connected to the storage battery via a relay. The method comprises the following steps: (S1) detecting whether a complete vehicle unloading signal is received or not; (S2) if a complete vehicle discharge signal is not received, further monitoring of the discharge status of the storage battery; and (S3) when the continuous discharge amount of the storage battery reaches a first discharge amount, controlling the relay to be turned off so that the storage battery can no longer supply the low-voltage load with electricity. This prevents the storage battery from discharging excessively.

EP 1 149 744 A2 relates to a battery with built-in anti-theft device, which has electrically controllable semiconductor switches which are connected between two adjacent cells in the battery, one or more diodes connected in parallel to the semiconductor switches, which have a polarity that, when the battery is charged from an external voltage source, they pass current, but, with normal use of the battery to supply power to external equipment, they block the current, which then only flows through the semiconductor switches. The diodes are Zener diodes with a breakdown voltage that exceeds the normal voltage drop across the semiconductor switches when they are in a conducting or blocking state.

From U.S. Pat. No. 5,805,054 A a system for preventing car theft is known which includes a bi-stable switching device which receives a voltage input, provides and controls a voltage output in order to drive an essential circuit in the engine electrical system of an automobile. The system has circuitry that is coupled to the switches of the standard door switch circuitry installed in motor vehicles that are connected to the interior lighting. When a door is opened, the circuitry of the system is thereby actuated to sequentially activate visible alarm devices, electrically shut off the engine and activate audible alarms.

SUMMARY

Against this background, the object to be solved by the disclosure is to provide a method and a device with which an unintentional switching on of the active discharge of a HV intermediate circuit can be reliably detected with little technical effort and subsequent measures can be initiated.

According to the disclosure, in spatial proximity to the discharge resistor and/or semiconductor switch a temperature sensor, e.g. a thermistor, is placed. When the active discharge is switched on, the temperatures of the discharge resistor and of the semiconductor switch rise significantly, which is detected via the change in the temperature value determined by the temperature sensor and triggers the initiation of follow-up measures.

The subject-matter of the disclosure is a device for actively discharging a high-voltage intermediate circuit with an intermediate circuit capacitor contained in a power electronics module of an electrically driven vehicle, comprising a control device for controlling the active discharge, a discharge circuit which can be driven by the control device for actively discharging the high-voltage intermediate circuit of the power electronics module, which has a semiconductor switch and a discharge resistor connected in series therewith, and a temperature sensor arranged in spatial proximity to the discharge resistor and/or the semiconductor switch, wherein the control device is configured to detect a sudden change in the temperature detected by the temperature sensor, for example a sudden change in the resistance of a thermistor, and to conclude therefrom an active discharge.

In one embodiment, the power module is used to provide an operating voltage for an electric drive machine of the vehicle. In a further embodiment, the power module is used to provide an operating voltage for an HV component in the vehicle, for example a heater, a charger, or a DC/DC converter.

In one embodiment of the device, the semiconductor switch is an IGBT or a MOSFET.

In one embodiment of the device, the discharge resistor consists of a single SMD resistor. In another embodiment of the device, the discharge resistor is a sheet resistor, for example a metal oxide sheet resistor (MOX sheet resistor). In yet another embodiment of the device, the discharge resistor is a foil resistor, for example a manganin foil resistor.

In one embodiment of the device, the temperature sensor is a thermocouple, i.e., a temperature-dependent resistance element. Suitable thermocouples include thermistors, RTDs (Resistance Temperature Devices), and semiconductor temperature sensors. In one embodiment of the device, the temperature sensor is a thermistor. In a further embodiment the thermistor is an NTC resistor. In another embodiment of the device, the thermistor is a PTC resistor.

No additional components are required for the galvanic separation of the temperature sensor and the discharge circuit. Galvanic isolation is achieved through spatial distance (compliance with the air and creepage distances) or through the layer structure (compliance with the creepage distance) of the power electronics. The temperature sensor can for example be arranged on a circuit board of the power electronics or it can be located outside the power electronics.

In one embodiment, the temperature sensor is located on the upper side of a circuit board, while the discharge resistor and the semiconductor switch are arranged on the lower side of the circuit board. In another embodiment, the temperature sensor is located on the top or bottom of a circuit board. An inner layer under the temperature sensor is with the discharge resistor and/or thermally and electrically connected to the semiconductor switch. In another embodiment, the temperature sensor is arranged on a housing of an external discharge resistor.

In one embodiment, the control device for controlling the active discharge comprises a microcontroller (μ-controller). In one embodiment, the microcontroller is set up to read in a temperature value determined by the temperature sensor.

In one embodiment, the control device is configured to control the discharge circuit in the event that the active discharge was not triggered by the control device in order to terminate the active discharge.

In a further embodiment, the control device is configured to disconnect a high-voltage energy storage unit of the vehicle, i.e., an HV battery or a fuel cell, from the vehicle electrical system in the event that the active discharge was not triggered by the control device.

In a further embodiment, the control device is configured to output a warning message, which is displayed on a display unit of the motor vehicle, in the event that the active discharge was not triggered by the control device.

A further subject-matter of the disclosure is a method for detecting an undesired active discharge of a high-voltage intermediate circuit with an intermediate circuit capacitor, which is contained in a power electronics module of an electrically driven vehicle. In the method, a control device for controlling the active discharge monitors the one temperature sensor which is in spatial proximity to a semiconductor switch and/or a discharge resistor, connected in series for this purpose, of a discharge circuit which can be controlled by the discharge control device for actively discharging the high-voltage intermediate circuit of the power electronics module, and concludes that there is an active discharge in the event of a sudden change in the temperature detected by the temperature sensor, for example a sudden change in the resistance of a thermistor.

If the active discharge was not triggered by the control device, the control device determines an undesired active discharge and controls the discharge circuit in order to abort the active discharge.

If the active discharge is successfully aborted, the control device detects a software error and generates a corresponding warning message. The warning message can be output on a display unit of the vehicle. For example, a yellow warning light or a corresponding warning symbol can be activated.

If the active discharge is unsuccessful, the control device detects a hardware error, generates a corresponding warning message, and disconnects the vehicle's high-voltage energy storage, i.e., an HV battery or a fuel cell, from the on-board network, for example via the contactors provided for this purpose. In the event of an unintentional active discharge of an intermediate circuit with a connected HV energy storage unit, the semiconductor switch is usually destroyed within a very short time. The discharge circuit is therefore unusable and continued operation of the electric drive system is associated with a safety risk. In addition, an arc can also develop. It is therefore important to disconnect the HV energy storage unit from the on-board network and to put the vehicle in a safe state. The warning message can be output on a display unit of the vehicle. For example, a red warning light or a corresponding warning symbol can be activated.

The solution according to the disclosure offers the advantage of a lower power consumption and a lower failure rate compared to the back measurement of the control signal. Less expensive components can be used and less PCB area is required. Further advantages and embodiments of the disclosure will be apparent from the description.

It will be appreciated that the above-mentioned features and those still to be explained hereinafter are usable not only in the particular specified combination but also in other combinations or alone, without leaving the scope of the present disclosure.

DETAILED DESCRIPTION

Figure 1:
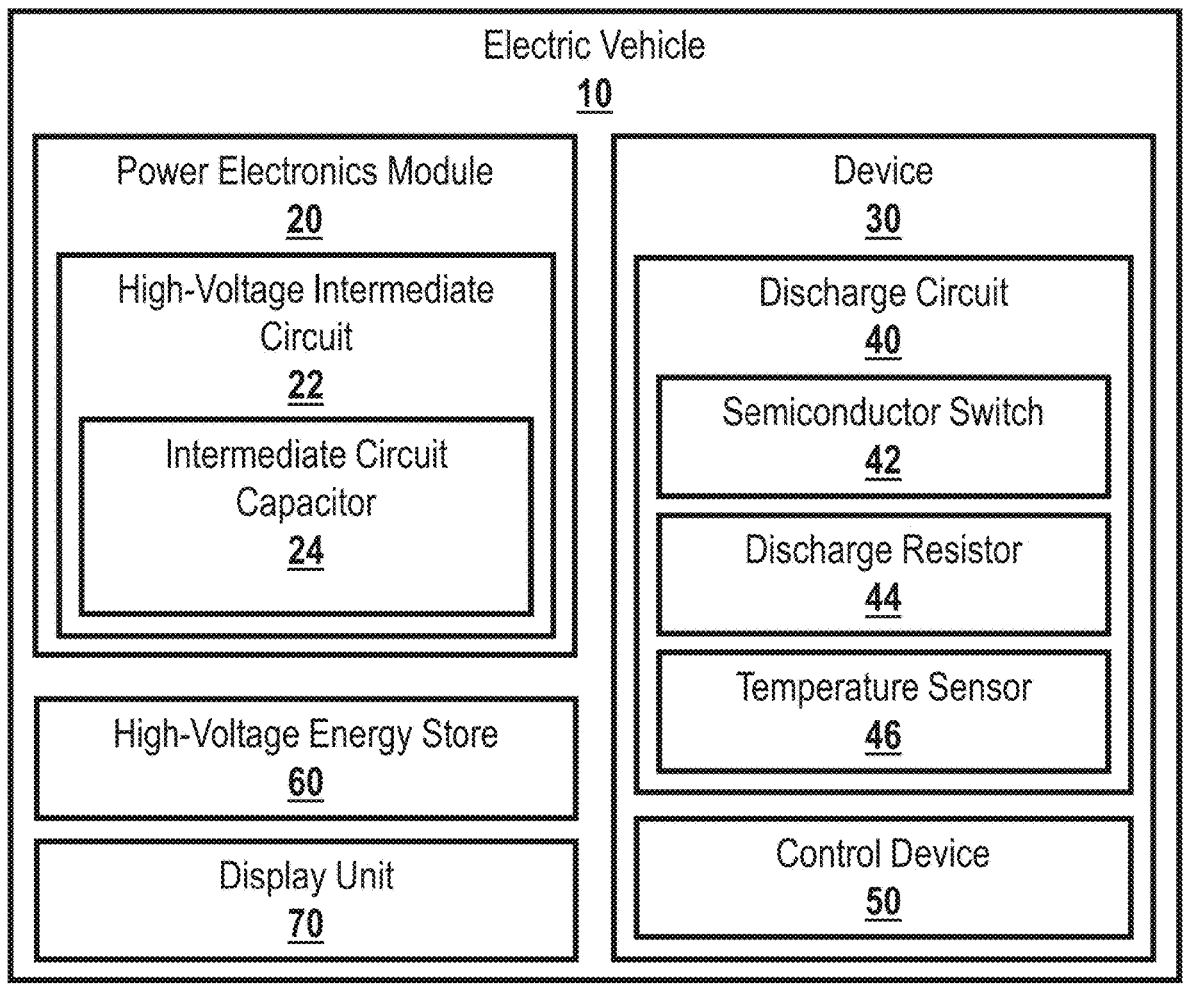
FIG. 1 is a schematic diagram showing an exemplary embodiment of a device according to the present invention.

FIG. 1 shows a schematic diagram for an electric vehicle 10 having a device 30 for discharging a high-voltage intermediate circuit 22 provided in a power electronics module 20 of the electric vehicle 10. The intermediate circuit 22 may include an intermediate circuit capacitor 24.

The device 30 may have a discharge circuit 40 including at least a semiconductor switch 42 and a discharge resistor 44. The device 30 may also include a temperature sensor 46 for monitoring changes in temperature of the discharge circuit 40, such as those caused by heat emanated from the switch 42 or resistor 44.

Figure 2A:
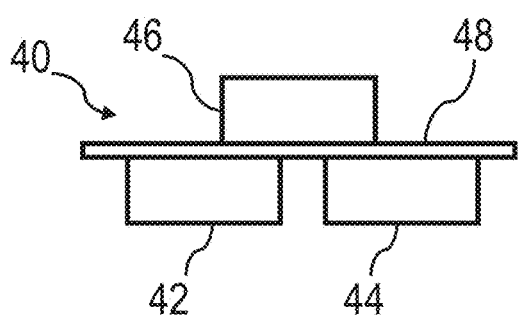
FIG. 2a is an exemplary arrangement of a temperature sensor according to the present invention.
Figure 2B:
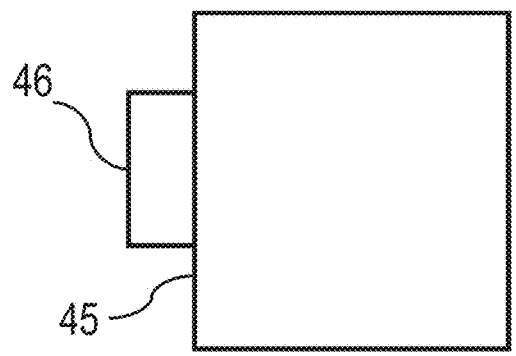
FIG. 2b is an exemplary arrangement of a temperature sensor according to the present invention.

As shown in FIG. 2A, the temperature sensor 46 may be provided on an upper side of a circuit board 48 while semiconductor switch 42 and discharge resistor 44 are provided on a lower side of the circuit board 48. As shown in FIG. 2B, the temperature sensor 46 may be provided on a housing 45 of the discharge resistor 44. However, it should be noted that the temperature sensor 46 may be provided at any location whereby the temperature of the discharge circuit 40 might be suitably monitored.

The device 30 may also have a control device 50 for controlling an active discharge of the intermediate circuit 22 facilitated by the discharge circuit 40. Control device 50 may also control the discharge circuit 40 in response to temperatures measured by the temperature sensor 46.

The control device 50 may be configured to abort an unwanted active discharging of the intermediate circuit 22 if it is determined that the active discharging was not specifically commanded or requested the control device 50. To do so, control device 50 may monitor the temperature sensor 46 for a sudden increase in temperature which may be inferred to have been caused by an active discharging of the intermediate circuit 22. If this sudden temperature increase is detected and it is determined that the active discharge was not commanded or requested by the control unit 50, the control unit 50 may then conclude or abort the active discharge.

In some advantageous embodiments, the electric vehicle 10 may be provided with a display unit 70 by which a warning message may be displayed indicating that an unwanted active discharge, or an active discharge that was not commanded by the control unit, has occurred.

Additionally, the control unit may be configured to also disconnect a high-voltage energy store 60 of the electric vehicle when aborting an unwanted active discharge.

Figure 3:
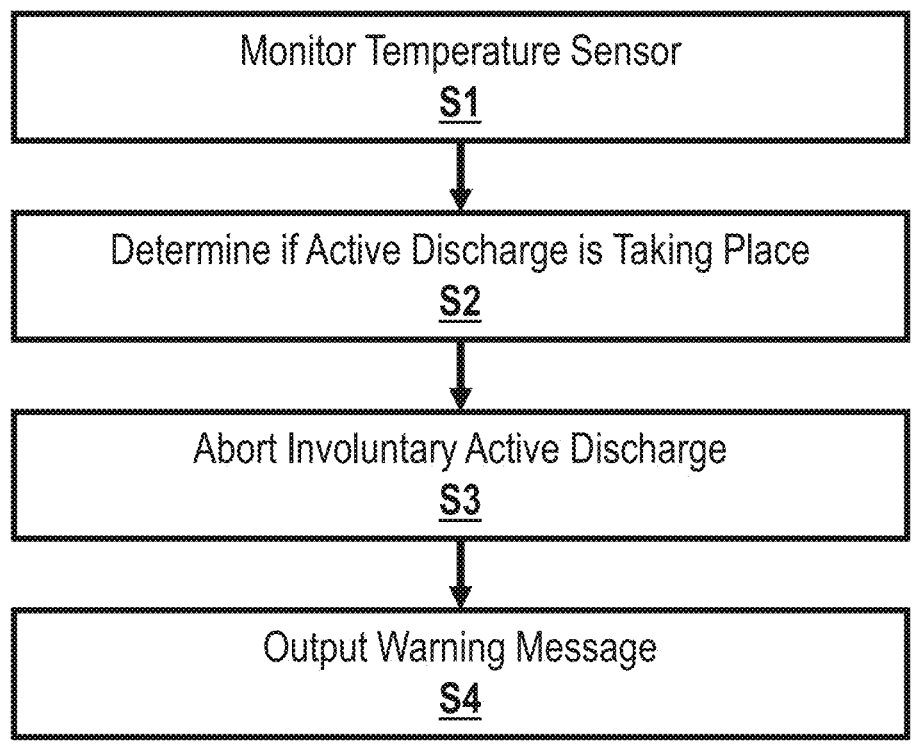
FIG. 3 is a flow chart showing an exemplary process according to the present invention.

FIG. 3 shows an exemplary method by which the control device 50 may be configured to carry out. The control device 50 many, in step S 1, monitor the temperature sensor 46. If the temperature sensor 46 detects a sudden increase in temperature, the control device 50 may, in step S2, identify that an active discharge is taking place. Then, in step S3, if an active discharge is taking place and is unwanted or was not commanded by the control device 50, then the control device may abort the active discharge. Additionally, the control device may be configured to, in step S4, output a warning message that an active discharge has been aborted.

The invention claimed is:

1. A device for actively discharging a high-voltage intermediate circuit contained in a power electronics module of an electrically driven vehicle and having an intermediate circuit capacitor, the device comprising:
   a control device for controlling the active discharge,
   a discharge circuit which is controllable by the control device for actively discharging the high-voltage intermediate circuit of the power electronics module, the discharge circuit comprising a semiconductor switch, a discharge resistor connected in series therewith, and a temperature sensor arranged in spatial proximity to the discharge resistor and/or the semiconductor switch,
   wherein the control device is configured to infer an active discharge from a sudden change in the temperature detected by the temperature sensor, and
   wherein the control device is configured to control the discharge circuit and terminate the active discharge when the active discharge was not requested by the control device.

2. The device according to claim 1, wherein the discharge resistor is an SMD resistor.

3. The device according to claim 1, wherein the discharge resistor is a metal oxide sheet resistor or a manganin foil resistor.

4. The device according to claim 1, wherein the temperature sensor is located on an upper side of a circuit board, and the discharge resistor and the semiconductor switch are arranged on a lower side of the circuit board.

5. The device according to claim 1, wherein the temperature sensor is arranged on a housing of an external discharge resistor.

6. The device according to claim 1, wherein the control device is further configured to disconnect a high-voltage energy storage unit of the vehicle, from an on-board network when the active discharge was not triggered by the control device.

7. The device according to claim 1, wherein the control device is adapted to output a warning message displayed on a display unit of the motor vehicle when the active discharge has not been triggered by the control device.

8. A method for detecting an active discharge of a high-voltage intermediate circuit which is contained in a power electronics module of an electrically driven vehicle and which comprises an intermediate circuit capacitor, the active discharge having not been requested by a control device which controls a discharge circuit provided for active discharging to the high-voltage intermediate circuit, the method comprising:
   monitoring, by the control device, a temperature sensor which is arranged in spatial proximity to a semiconductor switch and/or a discharge resistor connected in series therewith of the discharge circuit,
   determining the active discharge is occurring upon detection of a sudden change in temperature observed by the temperature sensor, and
   aborting the active discharge when the active discharge is determined to not have been requested by the control device.

9. The method according to claim 8, further comprising outputting a warning message indicating that the active discharge was not requested by the control device.

10. The device according to claim 2, wherein the temperature sensor is located on an upper side of a circuit board, while the discharge resistor and the semiconductor switch are arranged on a lower side of the circuit board.

11. The device according to claim 3, wherein the temperature sensor is located on an upper side of a circuit board, while the discharge resistor and the semiconductor switch are arranged on a lower side of the circuit board.

12. The device according to claim 2, wherein the temperature sensor is arranged on a housing of an external discharge resistor.

13. The device according to claim 3, wherein the temperature sensor is arranged on a housing of an external discharge resistor.

14. The device according to claim 2, wherein the control device is configured to disconnect a high-voltage energy storage unit of the vehicle from an on-board network when the active discharge was not triggered by the control device.

15. The device according to claim 3, wherein the control device is configured to disconnect a high-voltage energy storage unit of the vehicle from the on-board network when the active discharge was not triggered by the control device.

* * * * *